United States Patent
Koyama et al.

(10) Patent No.: US 8,436,382 B2
(45) Date of Patent: May 7, 2013

(54) OSCILLATION DEVICE

(75) Inventors: Yasushi Koyama, Kamakura (JP);
Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 246 days.

(21) Appl. No.: 12/954,507

(22) Filed: Nov. 24, 2010

(65) Prior Publication Data
US 2011/0155998 A1    Jun. 30, 2011

(30) Foreign Application Priority Data

Dec. 25, 2009  (JP) ................. 2009-295444

(51) Int. Cl.
*H01L 33/00*    (2010.01)
(52) U.S. Cl.
USPC ................... 257/98; 257/E23.059
(58) Field of Classification Search .......... 257/86, 257/98, 99, E23.059
See application file for complete search history.

(56) References Cited

U.S. PATENT DOCUMENTS 5,569,933 A    10/1996  Chu
6,395,409 B2 *  5/2002  Ueda et al. ................. 428/690

FOREIGN PATENT DOCUMENTS

JP    8-125215 A    5/1996

OTHER PUBLICATIONS

Electronics Letters, Apr. 25, 2004, vol. 41, No. 15, 872.

* cited by examiner

*Primary Examiner* — Quoc Hoang
(74) *Attorney, Agent, or Firm* — Canon USA Inc. IP Division (57) ABSTRACT

An oscillation device for oscillating a terahertz wave includes a substrate, an active layer which is provided on an upper portion of the substrate and which generates a terahertz wave by intersubband transition of carrier, and a luminous layer which is provided on an upper portion of the substrate and which generates light by interband transition of carrier. In addition, the luminous layer is arranged at a position at which the light generated in the luminous layer can radiate on the active layer.

8 Claims, 10 Drawing Sheets

| NAME OF LAYER | MATERIAL | FILM THICKNESS | DOPING CONCENTRATION | |
|---|---|---|---|---|
| FIRST CONTACT LAYER | n++InGaAs | 30 nm | $1\times10^{19}$ cm$^{-3}$ | ~116 |
| FIRST ELECTRICAL-CONTACT LAYER | n+InGaAs | 50 nm | $2\times10^{18}$ cm$^{-3}$ | ~102 |
| FIRST SPACER LAYER | InGaAs | 3 nm | | ~118 |
| FIRST BARRIER LAYER | AlAs | 1.3 nm | | ~111 |
| FIRST QUANTUM WELL LAYER | InGaAs | 7.6 nm | | ~114 |
| SECOND BARRIER LAYER | InAlAs | 2.6 nm | | ~112 |
| SECOND QUANTUM WELL LAYER | InGaAs | 5.6 nm | | ~115 |
| THIRD BARRIER LAYER | AlAs | 1.3 nm | | ~113 |
| SECOND SPACER LAYER | InGaAs | 5 nm | | ~119 |
| SECOND ELECTRICAL-CONTACT LAYER | n+InGaAs | 50 nm | $2\times10^{18}$ cm$^{-3}$ | ~103 |
| SECOND CONTACT LAYER | n++InGaAs | 500 nm | $1\times10^{19}$ cm$^{-3}$ | ~117 |

OSCILLATION DEVICE

BACKGROUND OF THE INVENTION

1. Field of the Invention

The present invention relates to an oscillation device for oscillating a terahertz wave.

2. Description of the Related Art

For active layers of oscillation devices each of which oscillates a terahertz wave (electromagnetic wave having a frequency in a range of 30 GHz to 30 THz in this specification), a quantum cascade laser and a resonant tunneling diode (hereinafter referred to as "RTD") are mainly used. These oscillation devices realize electromagnetic wave oscillation based on the intersubband transition of electrons in a semiconductor quantum well structure.

In particular, it is expected that an oscillation device using a double-barrier type RTD as the active layer is able to oscillate a terahertz wave in a frequency domain in the vicinity of 1 terahertz at room temperature. The double-barrier type RTD is formed of an InGaAs quantum well layer and InAlAs tunnel barrier layers, which are epitaxially grown on an InP substrate. In the region of a differential negative resistance which appears in voltage-current (V-I) characteristics, the RTD oscillates an electromagnetic wave by stimulated emission.

In order to use the oscillation device described above in the field of communication technology and/or imaging technology, the oscillation device is required not only to be small but also to be able to modulate the frequency of an oscillating terahertz wave.

An oscillation device in which the frequency of an oscillating terahertz wave is changed by changing a drive voltage in the above differential negative resistance region is disclosed in a non-patent document: ELECTRONICS LETTERS Vol. 41, No. 15, 872. In this case, a center frequency is 470 GHz, and a variable width of the frequency is 18 GHz. The above drive voltage functions, of course, as current injection into an RTD, and if the voltage is changed in order to change the frequency, for example, the power of the oscillating terahertz wave is also changed; hence, an improvement is required in view of controllability.

Accordingly, an oscillation device which changes the frequency of an oscillating terahertz wave is disclosed in Japanese Patent Laid-Open No. 8-125215 in which the intensity of light radiating on an RTD from the outside is changed, and the differential negative resistance and parasitic elements of the RTD are changed.

In the structure disclosed in Japanese Patent Laid-Open No. 8-125215, since light radiates on the RTD from the outside, a window structure for light incidence must be provided. This window structure is formed by making a hole in an electrode provided on an upper portion of an active layer. According to this window structure, since the contact area between the electrode and a layer provided thereunder is decreased, series resistance which is one of the above parasitic elements is increased. As a result, since the RC time constant is increased, and the upper limit of a cut-off frequency is decreased, the frequency band of an oscillating terahertz wave is narrowed.

SUMMARY OF THE INVENTION

The present invention provides an oscillation device which can change the frequency of an oscillating terahertz wave in a broadband with good controllability.

An oscillation device for oscillating a terahertz wave according to one aspect of the present invention includes: a substrate; an active layer which is provided on an upper portion of the substrate and which generates a terahertz wave by intersubband transition of carrier; and a luminous layer which is provided on an upper portion of the substrate and which generates light by interband transition of carrier, and in the above oscillation device, the luminous layer is arranged at a position at which the light generated in the luminous layer radiates on the active layer.

In addition, a semiconductor device according to another aspect of the present invention includes: a substrate; a multiple quantum well layer which is provided on an upper portion of the substrate and which is configured so that carrier transition occurs between sub-bands; a first electrical-contact layer provided on an upper portion of the multiple quantum well layer; a second electrical-contact layer which is provided on an upper portion of the substrate and on a lower portion of the multiple quantum well layer; and a luminous layer which is provided on an upper portion of the substrate and which generates light by interband transition of carrier. In the semiconductor device described above, the luminous layer is arranged at a position at which the light generated in the luminous layer radiates on the multiple quantum well layer and generates light having energy larger than bandgap energy in the second electrical-contact layer.

As described above, in the oscillation device of the present invention, the luminous layer is provided on an upper portion of the substrate. In addition, the luminous layer generates light by the interband transition of carrier. Furthermore, the luminous layer is arranged at a position at which the light generated in the luminous layer can radiate on the active layer. Hence, an oscillation device which is able to change the frequency of an oscillating terahertz wave in a broadband with good controllability can be provided.

Further features of the present invention will become apparent from the following description of exemplary embodiments with reference to the attached drawings.

DESCRIPTION OF THE EMBODIMENTS

Figure 1A:
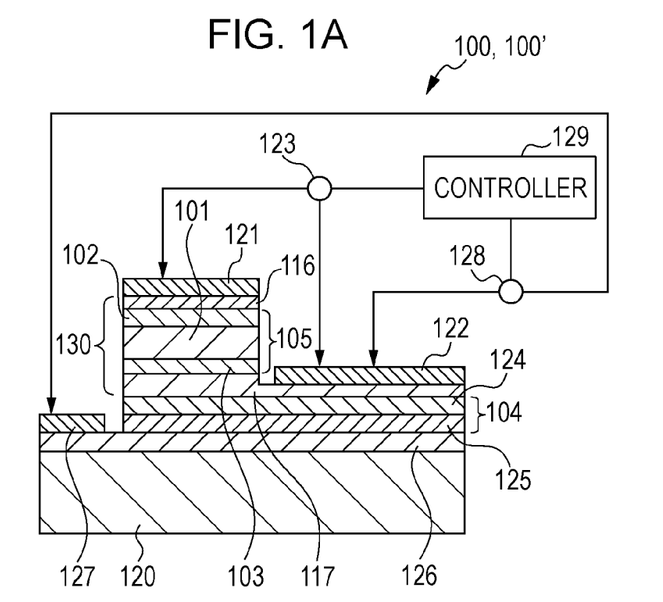
FIG. 1A is a cross-sectional view of a device of Example 1 of the present invention.
Figure 1B:
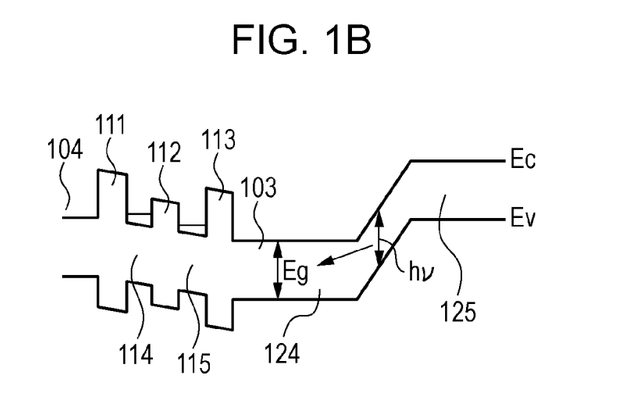
FIG. 1B is a schematic view illustrating the band structure in Example 1.
Figure 1C:
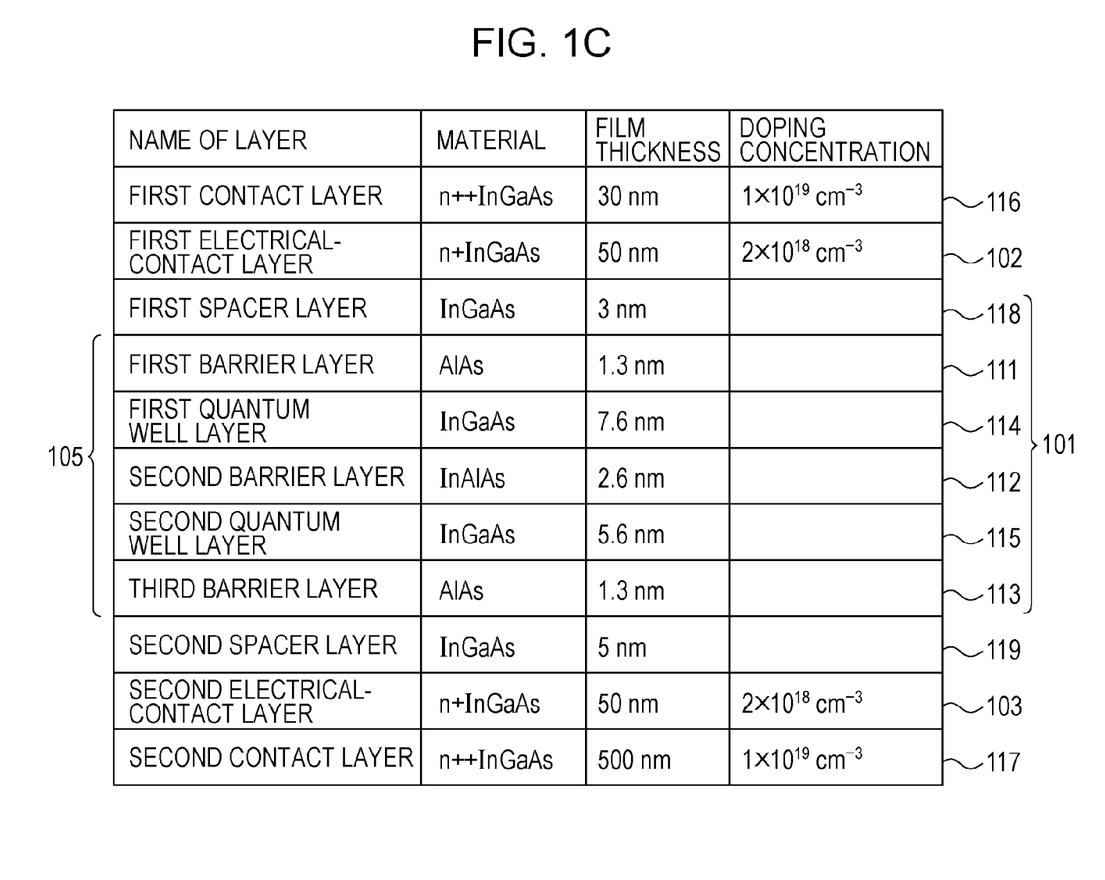
FIG. 1C is a table of layers of the device of Example 1.

An oscillation device for oscillating a terahertz wave according to this embodiment will be described with reference to FIGS. 1A to 1C.

An oscillation device 100 according to this embodiment includes an active layer 101 which is provided above a substrate 120 and which generates a terahertz wave by intersubband transition of carrier. Any medium (gain medium) having a gain of a generated terahertz wave may be used as the active layer 101. For example, the active layer 101 is preferably a multiple quantum well layer (hereinafter, referred to as "MQW layer") configured so that carrier transition occurs between sub-bands, and as described later, a resonance tunneling structure is preferably used.

Next, the oscillation device 100 includes a first electrical-contact layer 102 provided on the active layer 101. In addition, a second electrical-contact layer 103 is provided above the substrate 120 and on a lower portion of the active layer 101. As the first and second electrical-contact layers 102 and 103, a semiconductor doped with an impurity is preferably used.

The oscillation device 100 includes a luminous layer 104 which is provided above the substrate 120 and which generates light by the interband transition of carrier. The luminous layer 104 is preferably configured so that light can radiate at the interface (pn junction) between a p-type semiconductor layer 125 and an n-type semiconductor layer 124.

In addition, the luminous layer 104 is arranged at a position at which the light generated in the luminous layer 104 can radiate on the active layer 101. Accordingly, an oscillation device which can change the frequency of an oscillating terahertz wave in a broadband with good controllability can be provided.

Figure 5A:
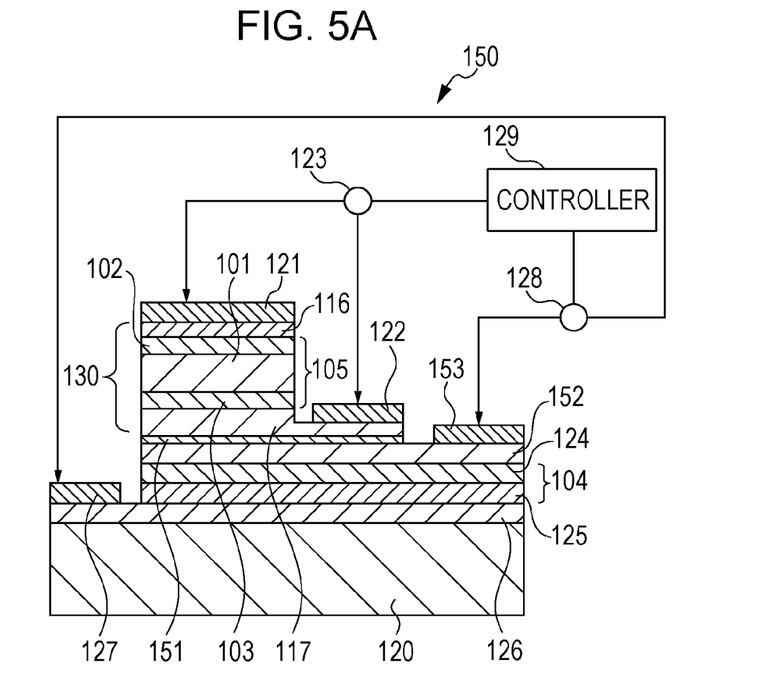
FIG. 5A is a cross-sectional view illustrating a modification of Example 1.

The luminous layer 104 is preferably formed as described below. First, the luminous layer 104 is formed so as to be able to emit light having energy larger than bandgap energy (or energy between bands) of a material forming the second electrical-contact layer 103. That is, the luminous layer 104 is preferably formed so that when the bandgap energy of the material forming the second electrical-contact layer 103 is represented by Eg and the bandgap energy of a material forming the luminous layer 104 is represented by hv, hv>Eg is satisfied. In addition, the luminous layer 104 is arranged at a position at which the light generated in the luminous layer 104 can radiate on the active layer 101 through the second electrical-contact layer 103, and for example, in the structure shown in FIG. 1A, the active layer 101 and the luminous layer 104 are laminated to each other above the substrate 120 with the transparent second electrical-contact layer 103 interposed therebetween. That is, it is preferable that the light emitted from the luminous layer 104 be coupled in a region between the second electrical-contact layer 103 and the active layer 101. Accordingly, the light emitted from the luminous layer 104 can radiate on the active layer 101 without being relatively absorbed by the second electrical-contact layer 103. In addition, the luminous layer 104 is preferably provided under the active layer 101. Hence, when the light emitted from the luminous layer 104 radiates on the active layer 101, the active layer 101 is relatively uniformly irradiated with the light. The details of the above structure will be described later with reference to FIG. 1A, FIG. 5A, and the like.

In addition, as described later with reference to FIG. 6C, the luminous layer 104 and the active layer 101 may both be provided above the substrate 120. In other words, the luminous layer 104 may be provided above the substrate 120 so as to be parallel to the active layer 101.

In addition, the structure is preferably formed so that carriers injected into the first electrical-contact layer 102 are extracted from the second electrical-contact layer 103. That is, the structure is preferably formed so that the light generated in the luminous layer 104 radiates on the second electrical-contact layer 103 located at a collector side.

In addition, the oscillation device 100 preferably has a resonance portion which is provided above the substrate 120 and which resonates a terahertz wave generated in the active layer 101. Although the resonance portion 212 is a patch antenna, it may also be formed of a slot antenna. In this case, the resonance portion 212 is formed so as to emit a resonated terahertz wave and also functions as an antenna.

(Other Embodiments)

The oscillation device of the above embodiment may also be applied to a logic circuit as a semiconductor device. For example, when being connected to a base of a hetero bipolar transistor, a semiconductor device according to this embodiment can be applied to a digital logic circuit. In this case, of course, it is not necessary to oscillate an electromagnetic wave, such as a terahertz wave, as in the above embodiment.

First, a semiconductor device 100' includes an MQW layer 101, the first electrical-contact layer 102, the second electrical-contact layer 103, and the luminous layer 104, each of which is arranged above the substrate 120. The MQW layer 101 has a multiple quantum well structure in which intersubband transition occurs, and a resonant tunneling structure is preferably used. In this case, the semiconductor device 100' functions as a resonant tunneling diode. In addition, the first electrical-contact layer 102, the MQW layer 101, and the second electrical-contact layer 103 are laminated in this order.

In addition, the second electrical-contact layer 103 is at least formed of a material having a bandgap energy Eg. The luminous layer 104 includes a pn junction of compound semiconductors and generates light having an energy hv associated with the interband transition.

The energy hv of the light is larger than the above bandgap energy Eg, and this is one of the features of this embodiment. In addition, the luminous layer 104 is arranged at a position at which the light generated in the luminous layer 104 is partially coupled and absorbed in parts of the electrical-contact layers 102 and 103 and the MQW layer 101.

As a result, the electric field distribution is changed by the influence of electron-hole pairs generated by the optical absorption, and the band structure in the vicinity thereof is changed. Hence, the sub-band structure in the MQW layer 101 is changed. This quantum confined Stark effect (QCSE) changes the characteristics of the intersubband transition in the MQW layer 101 and changes the oscillating frequency of carriers of a semiconductor device (such as a resonant tunneling diode). That is, by changing the intensity of the light generated in the luminous layer 104, the semiconductor device is configured so that the oscillating frequency of carriers thereof can be controlled.

EXAMPLES

Example 1

Resonant Tunneling Diode

The structure of Example 1 will be described with reference to FIGS. 1A to 1C. In this example, a resonant tunneling structure is used as the MQW layer 101 in which the intersubband transition occurs. That is, a resonant tunneling diode RTD 130 is formed by a semiconductor laminate structure including the first electrical-contact layer 102, the MQW layer 101, and the second electrical-contact layer 103. The first electrical-contact layer 102 is a layer for injecting electrons (carriers in this example) into the MQW layer 101, and the second electrical-contact layer 103 is a layer for extracting electrons from the MQW layer 101. In addition, the first electrical-contact layer 102 and the second electrical-contact layer 103 are each formed of a material having a bandgap energy Eg.

The MQW layer 101 had a triple-barrier type resonant tunneling structure in which a tunnel barrier layer and a quantum well layer are alternately laminated to form a semiconductor heterostructure. The MQW layer 101 is formed to have a resonant tunneling structure layer 105 in which a first tunnel barrier layer 111, a first quantum well layer 114, a second tunnel barrier layer 112, a second quantum well layer 115, and a third tunnel barrier layer 113 are laminated in this order. In this example, a triple-barrier quantum well structure layer 105 having the following film structure is used.

| First barrier layer | AlAs | 1.3 nm |
| First quantum well layer | InGaAs | 7.6 nm |
| Second barrier layer | InAlAs | 2.6 nm |
| Second quantum well layer | InGaAs | 5.6 nm |
| Third barrier layer | AlAs | 1.3 nm |

In this example, the first quantum well layer 114, the second barrier layer 112, and the second quantum well layer 115 are formed of InGaAs/InAlAs in lattice matched to InP having a plane direction (100). The first barrier layer 111 and the third barrier layer 113 are formed of AlAs which is not lattice matched to InP, are thinner than a critical film, and function as a barrier having high energy.

In addition, the MQW layer 101 includes a first spacer layer 118 and a second spacer layer 119, each of which is formed of non-doped InGaAs, and the first spacer layer 118, the resonant tunneling structure layer 105, and the second spacer layer 119 are laminated in this order. The first electrical-contact layer 102 and the second electrical-contact layer 103 are each formed of n+InGaAs. A first contact layer 116 and a first ohmic electrode 121 are connected to the first electrical-contact layer 102, and a second contact layer 117 and a second ohmic electrode 122 are connected to the second electrical-contact layer 103. In this example, the first contact layer 116 and the second contact layer 117 are formed of n++InGaAs, and the first ohmic electrode and the second ohmic electrode are formed of Ti/Pd/Au. The semiconductor device 100' is connected to a power supply 123 through the first ohmic electrode 121 and the second ohmic electrode 122, and a drive bias voltage is supplied. By the structure described above, in the semiconductor device 100', the differential negative resistance as shown in FIG. 2B appears in the current-voltage characteristics by the resonant tunneling effect which is the intersubband transition.

The luminous layer 104 is a layer which generates light A having an energy hv associated with the interband transition, and in this example, a pn junction of direct transition type compound semiconductors is used. The luminous layer 104 includes the n-type semiconductor layer 124 and the p-type semiconductor layer 125, which are laminated in this order. The n-type semiconductor layer 124 is connected to the second ohmic electrode 122 through the second contact layer 117. In addition, the p-type semiconductor layer 125 is connected to a p-type ohmic electrode 127 through a p contact layer 126. The n-type semiconductor layer 124 is a layer which injects electrons into the pn junction, and in this example, doped n−InGaAs (500 nm in thickness, dopant: Si at a concentration of $1 \times 10^{+17}/cm^3$) is used. In addition, the p-type semiconductor layer 125 is a layer which injects holes into the pn junction, and in this example, doped p−InGaAs (500 nm in thickness, dopant: Zn at a concentration of $1 \times 10^{+17}/cm^3$) is used. In the luminous layer 104 used in this example, light A having a wavelength of 1.65 μm is generated associated with the interband transition of InGaAs. The p-type semiconductor layer 125 is connected to the p-type ohmic electrode 127 through the p contact layer 126 formed of heavily doped InGaAs (500 nm in thickness, dopant: Zn at a concentration of $5 \times 10^{+18}/cm^3$). The p-type ohmic electrode 127 is formed of Ti/Pd/Au. The second ohmic electrode 122 and the p-type ohmic electrode 127 are connected to a power supply 128 to apply a bias voltage to the luminous layer 104, so that the intensity of the light to be generated can be controlled. The power supply 123 and the power supply 128 are connected to a controller 129, so that operating conditions of the semiconductor device 100' can be preferably controlled by the controller 129.

In this example, the luminous layer 104 is preferably arranged in the vicinities of the electrical-contact layers 102 and 103 and the MQW layer 101 so that the light generated in the luminous layer 104 is coupled and absorbed in the electrical-contact layers 102 and 103 and the MQW layer 101 and the sub-band transition characteristics can be controlled. In order to more effectively perform the above coupling and absorption of light, the luminous layer 104 is preferably arranged at a position at which the light A is absorbed in the second electrical-contact layer 103 and a region between the second electrical-contact layer 103 and the MQW layer 101. That is, the first electrical-contact layer 102, the MQW layer 101, the second electrical-contact layer 103, and the luminous layer 104 are preferably arranged in this order in the thickness direction of the substrate.

Next, the operation of the semiconductor device according to Example 1 will be described.

Figure 2A:
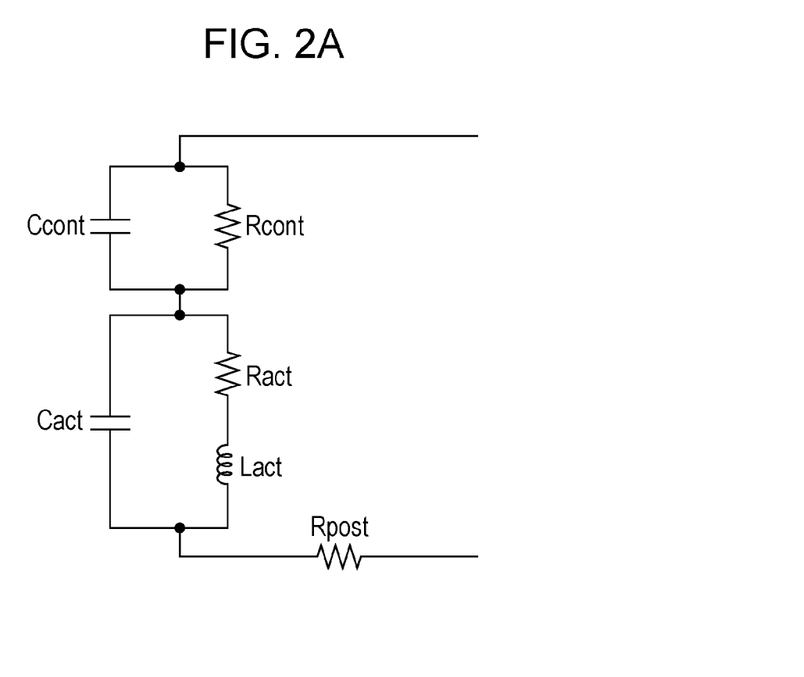
FIG. 2A is a schematic circuit diagram of the device of Example 1.
Figure 2B:
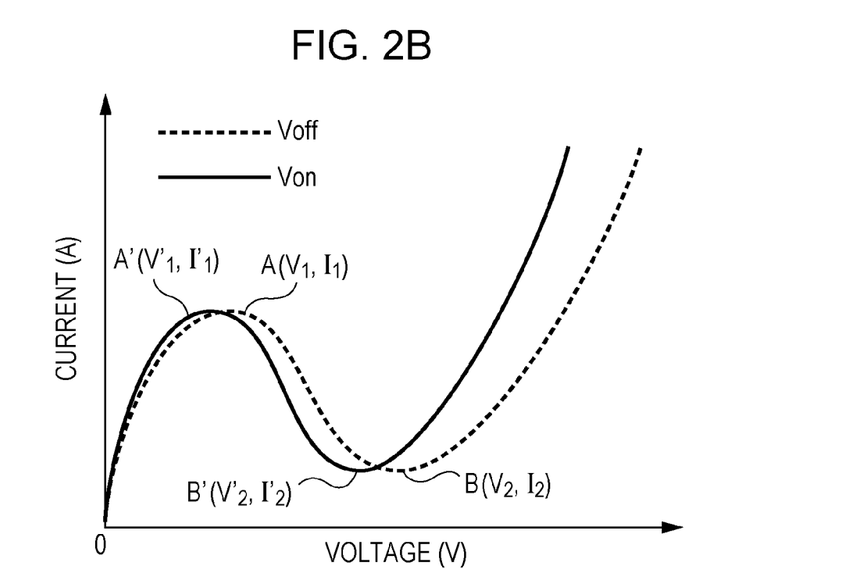
FIG. 2B is a graph illustrating the differential negative resistance in Example 1.

The resonant tunneling diode (RTD) used as the MQW layer 101 in this example is represented by an equivalent circuit shown in FIG. 2A as disclosed, for example, in Patent Document 1 and Jpn. J. Appl. Phys., Vol. 47, No. 6, 2008, pp. 4, 375-4, 384. In FIG. 2A, Rcont and Ccont represent a contact resistance component and a contact capacity component, respectively, between an ohmic electrode and a contact layer, and Rpost represents a resistance component caused by a mesa structure connected to the RTD in series. In addition, Ract represents the differential negative resistance (<0) of the RTD. In addition, Cact represents a capacity component of the RTD, and Lact represents an inductance component of the RTD and indicates the delay time of electrons in the RTD in consideration of the tunneling time and the transit time in the depletion layer. The upper limit of the oscillating frequency of electrons which can be extracted outside from the RTD is determined by the RC time constant which is estimated from the series resistance and electrostatic capacitance inside this RTD. In this example, the semiconductor device 100' is formed so that a related window structure for light incidence is not provided. Accordingly, since Rcont which is one of the major factors determining the upper limit of the frequency can be sufficiently decreased, the structure is formed so that operation can be performed in a terahertz band.

The light generated in the luminous layer 104 is coupled and absorbed in the electrical-contact layers 102 and 103 and the MQW layer 101, so that electron-hole pairs are generated. In this case, if a bias is applied so that the second electrical-contact layer 103 extracts electrons from the MQW layer 101, a depletion region will be generated between the second electrical-contact layer 103 and the MQW layer 101; however, in this region, electron-hole pairs are likely to be generated. The electric field distribution of the resonant tunneling structure 105 is changed by the influence of electron-hole pairs. As a result, the capacity component Cact of the RTD is changed. In addition, since the sub-band structure in the MQW layer 101 is changed by the QCSE associated with the change in electric field distribution of the resonant tunneling structure layer 105, the differential negative resistance Ract is also changed.

Figure 3:
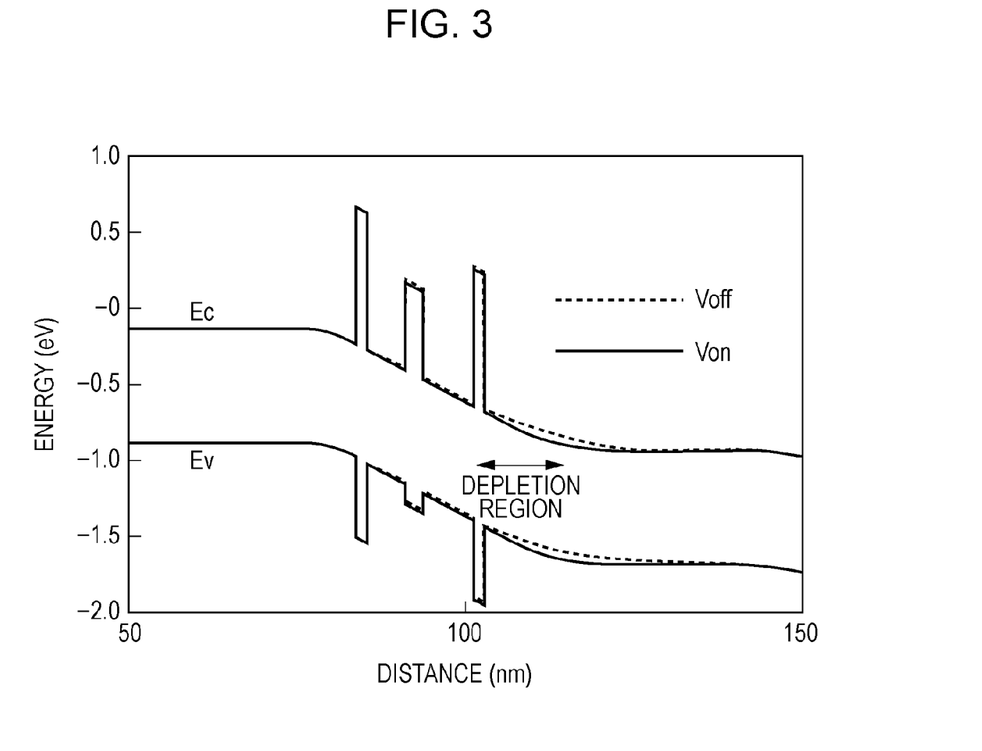
FIG. 3 is a graph illustrating the band structure of a semiconductor device of Example 1.

In the film structure used in this example, an example of the simulation result of the change in band structure in the resonant tunneling structure 105, which is associated with the absorption of light generated in the luminous layer 104, is shown in FIG. 3. The horizontal axis indicates the distance in a thickness direction, and the vertical axis indicates the energy. In this figure, Voff indicates the state in which drive bias voltages of 0 V, 0.7 V, and 0.7 V are applied to the first ohmic electrode 121, the second ohmic electrode 122, and the p-type ohmic electrode 127 from the power supply 123 and the power supply 128. In addition, Von indicates the state in which drive bias voltage of 0 V, 0.7 V, and 1.4 V are applied to the first ohmic electrode 121, the second ohmic electrode 122, and p-type ohmic electrode 127 from the power supply 123 and the power supply 128. In the state of Von, the amount of increase in electron-hole pair density associated with the optical absorption is assumed to $5 \times 10^{+17}/cm^3$. The sub-band structure of the MQW layer 101 is changed by ON/OFF of the bias voltage to the luminous layer 104. As a result, as shown in FIG. 2B, the current-voltage characteristics of the semiconductor device 100' are changed by ON/OFF of the bias voltage to the luminous layer 104. Von indicates the state in which the bias voltage from the power supply 128 is turned on so that the luminous layer 104 emits light, and Voff indicates the state in which the bias voltage from the power supply 128 is turned off so that the luminous layer 104 does not emit light. As shown in FIG. 2B, the region of the differential negative resistance in the Von state shifts to a lower voltage side as a whole as compared to that in the Voff state, a peak point shifts to a point A', a valley point shifts to a point B', and the differential negative resistance Ract is decreased. In addition, when the intensity of the light A is controlled by the bias voltage supplied from the power supply 128 through the controller 129, desired conditions between Von and Voff can be controlled.

As described above, in the semiconductor device according to this example, when the intensity of light from the luminous layer arranged on the same substrate is controlled, the characteristics of the intersubband transition of the multiple quantum well structure and the oscillating frequency of carriers can be controlled in a terahertz band. According to this example, a current injection type semiconductor device can be realized which is operable in a terahertz belt, which can realize frequency variable and frequency modulation with good controllability, which is excellent in high speed response, which is small, and which is operable at room temperature.

Figure 5B:
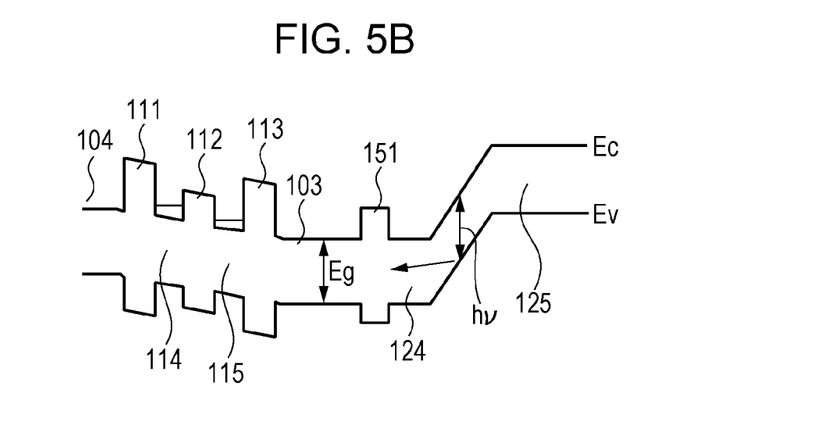
FIG. 5B is a schematic view illustrating the band structure of the modification shown in FIG. 5A.

In addition, as another example of the luminous layer described in this example, the following structure may also be mentioned. A semiconductor device 150 shown in FIG. 5A has the structure in which a barrier layer 151 is inserted between the second electrical-contact layer 103 and the luminous layer 104 so as to prevent generated electron-hole pairs from flowing to a luminous layer side. In this case, the barrier layer 151 is formed of non-doped InAlAs having a thickness of 50 nm, and the band structure is as shown in FIG. 5B. In this case, the n-type semiconductor layer 124 is connected to the power supply 128 through an n-type contact layer 152 and an n-type ohmic electrode 153.

Figure 6A:
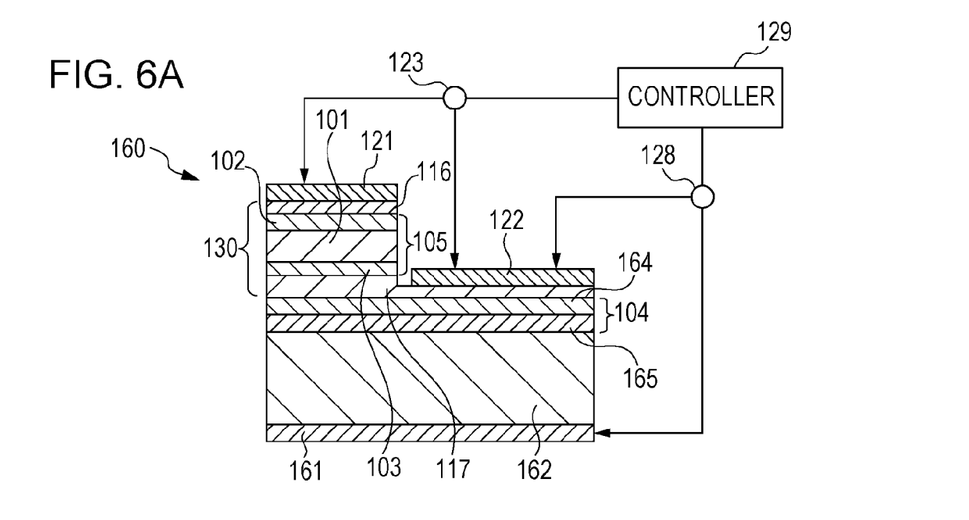
FIG. 6A is a cross-sectional view illustrating another modification of Example 1.
Figure 6B:
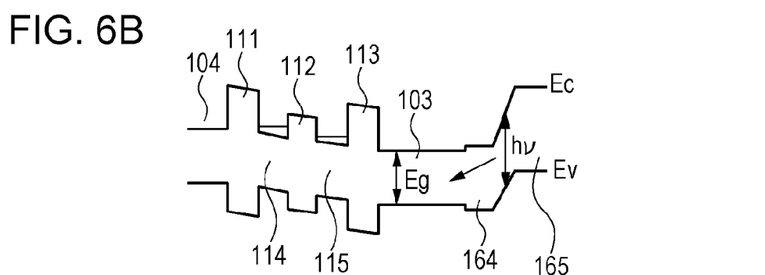
FIG. 6B is a schematic view illustrating the band structure of the modification shown in FIG. 6A.
Figure 6C:
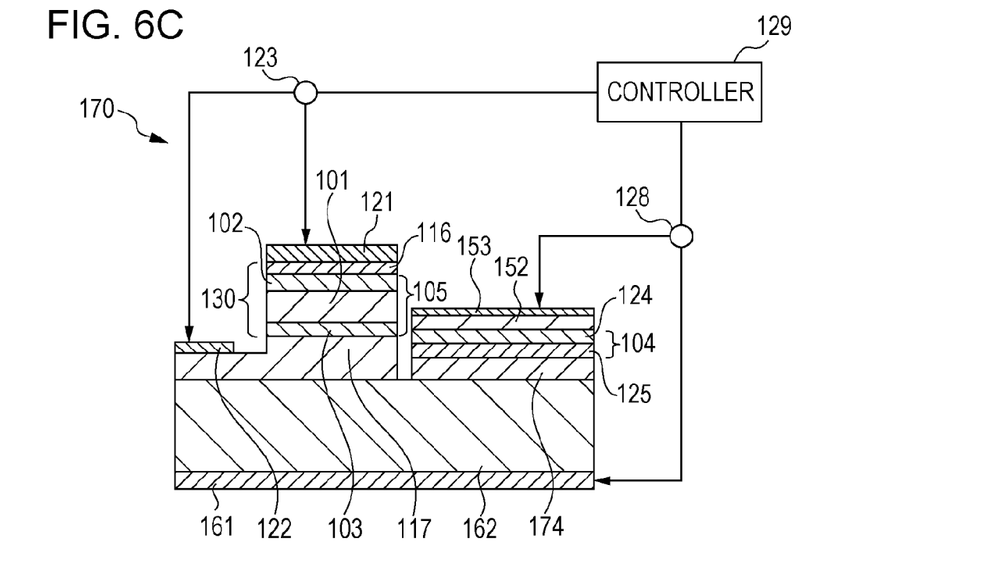
FIG. 6C is a cross-sectional view illustrating another modification of Example 1.

In addition, as a semiconductor device 160 shown in FIGS. 6A and 6B, a pn junction may be used which is formed between InGaAsP (200 nm in thickness, wavelength of 1.3 μm) used as an n-type semiconductor layer 164 and InP (500 nm in thickness, dopant: Zn at a concentration of $3 \times 10^{+17}/cm^3$) used as a p-type semiconductor layer 165. As a power supply system, power supply may be performed from the rear surface of a p-type semiconductor substrate 162 through a rear surface p-type ohmic electrode 161. In addition, as a semiconductor device 170 shown in FIG. 6C, the structure may be formed in such a way that an end-face luminescence type luminous portion 104 is arranged in a lateral direction of the MQW layer 101 as the arrangement of the luminous layer 104. The luminous layer 104 is preferably arranged at a position at which light is coupled and absorbed in the second electrical-contact layer 103 and a region between the second electrical contacts 103 and the MQW layer 101. This structure is formed by using an embedding regrowth technique for semiconductor crystals.

In this example, the triple-barrier resonant tunneling diode formed of InGaAs/InAlAs and InGaAs/AlAs grown on the InP substrate is described as the MQW layer. However, besides the structures and material systems described above, a semiconductor device may also be provided using other structures and materials in combination. For example, as the MQW layer, there may be used a resonant tunneling diode having a double-barrier quantum well structure, a resonant tunneling diode having a quadruple-barrier quantum well or more, and a cascade-connected multiple quantum well structure well known as a quantum cascade laser. In addition, as the material system, for example, combinations, such as GaAs/AlGaAs, GaAs/AlAs, and InGaAs/GaAs/AlAs formed on a GaAs substrate; InGaAs/AlGaAsSb formed on an InP substrate; InAs/AlAsSb and InAs/AlSb formed on an InAs substrate; and SiGe/SiGe formed on a Si substrate, may also be used. These structures and materials may be appropriately selected in accordance with a desired frequency and the like. In this example, although the case in which the carriers are electrons is only described, the present invention is not limited to the above case, and holes may also be used as the carriers. In addition, the material for the substrate may be selected in accordance with the application, and for example, a semiconductor substrate, such as a silicon substrate, a gallium arsenide substrate, an indium arsenide substrate, or a gallium phosphorus substrate, a glass substrate, a ceramic substrate, or a polymer substrate may also be used.

Example 2

Terahertz Electromagnetic Wave Generation Device

Figure 4A:
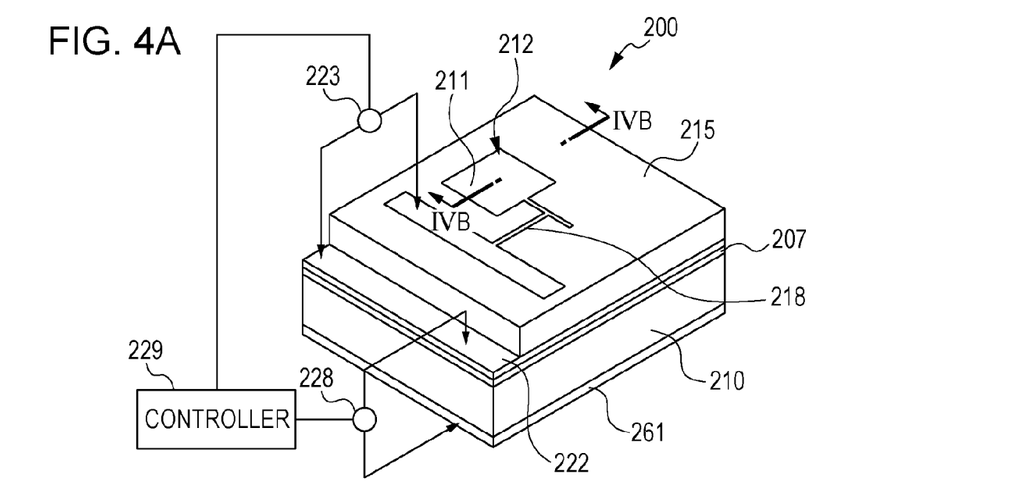
FIG. 4A is a schematic view of a terahertz electromagnetic wave generation device of Example 2 of the present invention.
Figure 4B:
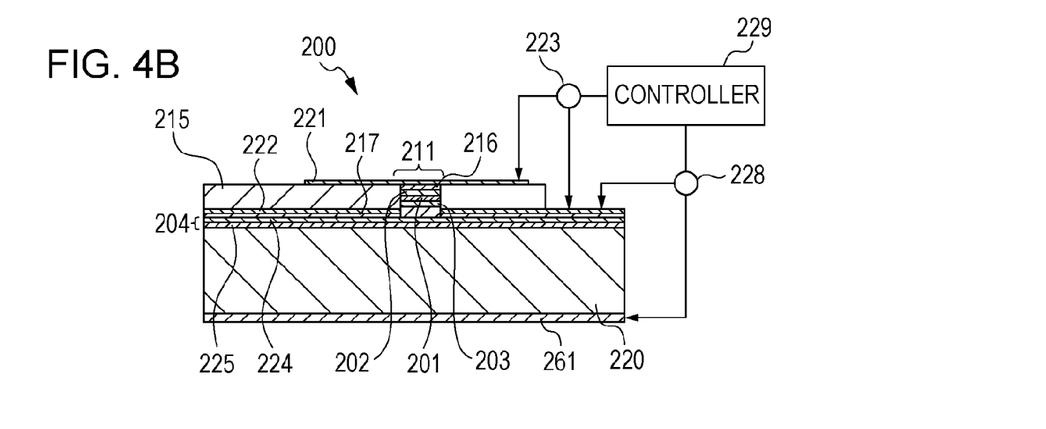
FIG. 4B is a cross-sectional view of the terahertz electromagnetic wave generation device shown in FIG. 4A.
Figure 7A:
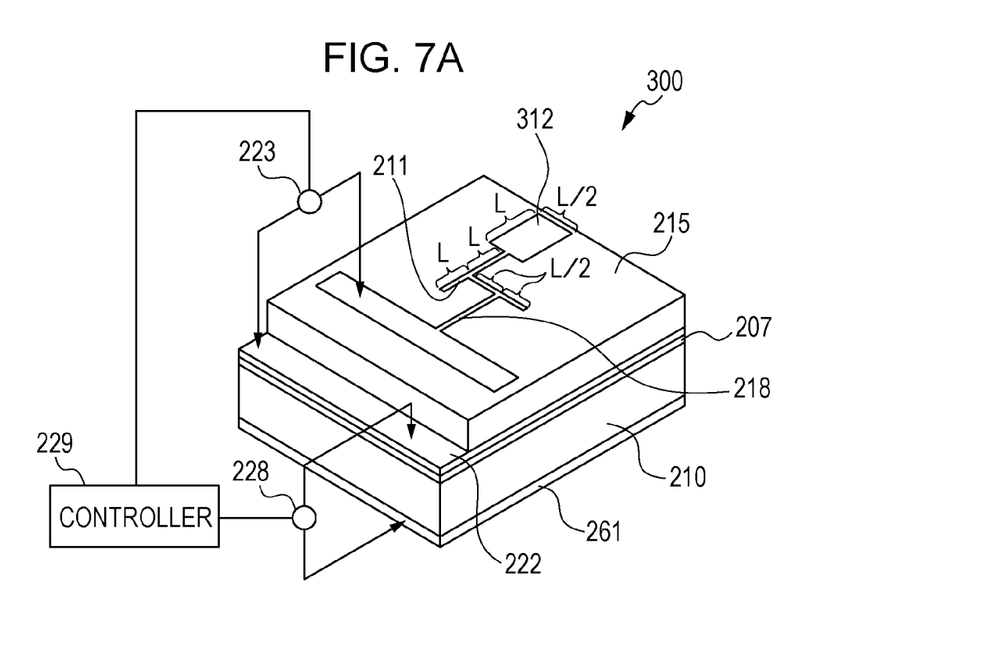
FIG. 7A is a schematic view of a terahertz electromagnetic wave generation device of Example 2.
Figure 7B:
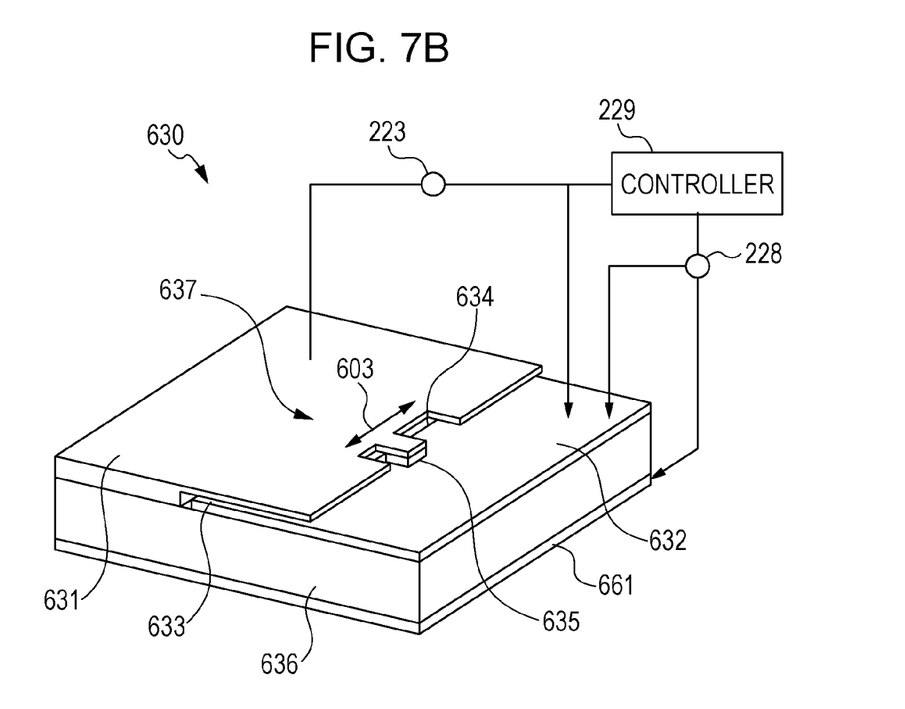
FIG. 7B is a schematic view of another terahertz electromagnetic wave generation device of Example 2.

In Example 2, a terahertz electromagnetic wave generation device will be described which uses the semiconductor device of Example 1 as the active layer. FIGS. 4A and 4B are schematic views of a terahertz electromagnetic wave generation device using a patch antenna structure as an electromagnetic wave resonator. FIG. 7A is a schematic view of a terahertz electromagnetic wave generation device using a microstrip patch antenna structure as an electromagnetic resonator, and FIG. 7B is a schematic view of a terahertz electromagnetic wave generation device using a slot antenna structure as an electromagnetic resonator.

In this example, the structure including the resonant tunneling diode described in Example 1 is used for an RTD 211 functioning as an active layer having an electromagnetic wave gain, and an MQW layer 201 includes the same film structure as that of the MQW layer 101 described in Example 1. Hence, as in the case of Example 1, the differential negative resistance as showed in FIG. 2B appears by a resonance tunneling phenomenon in the current-voltage characteristics of a terahertz electromagnetic wave generation device 200 which includes the RTD 211.

The patch antenna 212 is formed of the RTD 211, an upper electrode layer 221, a GND electrode layer 222, and a dielectric layer 215, and an electromagnetic wave resonates in the dielectric layer 215 located in a region between the upper electrode layer 221 and the GND electrode layer 222. A patch antenna type resonator is able to more efficiently extract a terahertz electromagnetic wave to the space and has a resonator structure advantageous to form an array and/or to increase an output power. In this resonator structure, structural elements, such as the dielectric constant and thickness of the dielectric layer 215, the length of the side of the patch antenna 212, and the size and position of the RTD 211, are important factors to determine the oscillating frequency. The patch antenna 212 used in this example is a part of the upper electrode layer 221 and has a square pattern of 200 μm by 200 μm. In addition, the RTD 211 is arranged at a position shifted 40 μm from the antenna center along the IVB-IVB direction.

The RTD 211 is provided between the upper electrode layer 221 and the GND electrode layer 222 so as to be able to apply a bias voltage required for driving the device. The RTD 211 is formed of a first contact layer 216, a first electrical-contact layer 202, the MQW layer 201, a second electrical-contact layer 203, and a second contact layer 217 laminated in that order and has a mesa structure having a diameter of approximately 2 μm. The upper electrode layer 221 is formed of the patch antenna 212 and a power supply line 218, and a bias voltage required for driving the RTD 211 is supplied from a power supply 223 through the power supply line 218. The upper electrode layer 221 is formed by performing lift-off of a Ti/Pd/Au layer (20 nm/20 nm/200 nm) formed by vacuum deposition.

In addition, the Ti/Pd/Au layer is known as a low contact-resistance ohmic electrode for a heavily doped InGaAs. Benzo-cyclo-butene (BCB) known as a low-loss material in a high frequency electromagnetic wave is used for the dielectric layer 215. The thickness of a BCB film used as the dielectric layer 215 is 3 μm and is formed using a spin coating method and a dry etching method. An insulating layer 207 is a layer for insulating the GND electrode 222 from the p-type semiconductor substrate and is formed in such a way that silicon nitride is formed by plasma CVD, and reactive ion etching (RIE) is then performed. The GND electrode layer 222 is a ground electrode in the resonator and is formed of a Ti/Pd/Au/Ti layer (20 nm/20 nm/200 nm/20 nm) by a vacuum deposition method.

A luminous layer 204 is a layer which generates light A having an energy hv associated with the interband transition, and the pn junction of the compound semiconductors disclosed in Example 1 is used. In particular, the luminous layer 204 is formed of an n-type semiconductor layer 224 and a p-type semiconductor layer 225 laminated in this order. The n-type semiconductor layer 224 is connected to the GND electrode layer 222 through the second contact layer 217. In addition, the p-type semiconductor layer 225 is connected to a p-type ohmic electrode 261 through a p-type semiconductor substrate 220 so as to apply a bias voltage to the luminous layer 204 from the rear surface of the substrate 220. The power supply 223 and a power supply 228 are connected to a controller 229, and the terahertz electromagnetic wave generation device 200 of this example is formed so that the frequency of a generated electromagnetic wave can be preferably controlled by the controller 229.

Figure 4C:
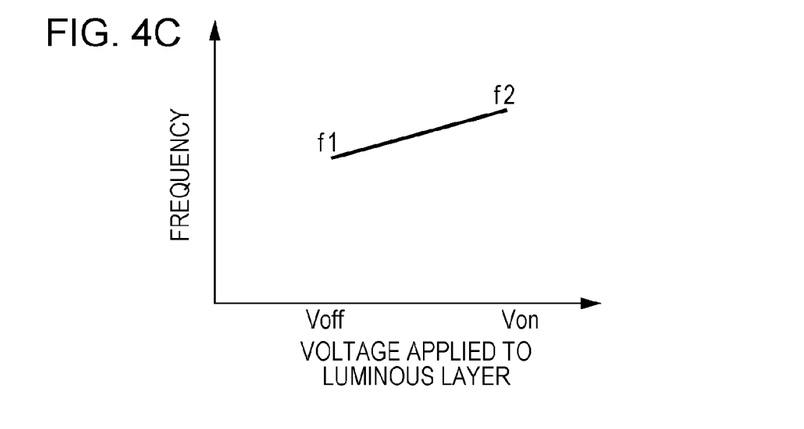
FIG. 4C is a graph illustrating the relationship between the frequency and the voltage in Example 2.

In the terahertz electromagnetic wave generation device 200 of this example, the basic oscillation is determined by a resonant frequency of LC of a resonance circuit in which a load resistance, a capacity component, and an inductance component, each of which is determined by the structure of a resonator, are connected to the equivalent circuit shown in FIG. 2A. As described in Example 1, in the electromagnetic wave generation device 200, in accordance with ON/OFF of the bias voltage from the power supply 228, at least two types of differential negative resistances Ract and capacity components Cact are obtained from the RTD 211. As a result, the resonant frequency of the entire resonance circuit is changed even in the same patch antenna type resonator, and the change in frequency of a generated terahertz electromagnetic wave occurs as shown in FIG. 4C. In addition, when the intensity of light is controlled by the bias voltage from the power supply 228, the oscillating frequency can be controlled under preferable conditions. In addition, when the bias voltage from the power supply 228 is modulated, and the intensity of the light A from the luminous layer 204 is modulated, the oscillating frequency of the terahertz wave electromagnetic wave generation device 200 can also be modulated. Furthermore, when a plurality of the terahertz electromagnetic wave generation devices 200 is arranged on the same substrate in the form of an array matrix, a terahertz electromagnetic wave generation device capable of generating terahertz electromagnetic waves having a plurality of frequencies can be realized by one chip.

As another example of the electromagnetic wave resonator structure, a terahertz electromagnetic wave generation device 300 using the resonator having a microstrip type patch antenna structure shown in FIG. 7A may also be used. A microstrip patch antenna 312 is formed of a patch portion primarily functioning as an electromagnetic wave resonance portion and an electromagnetic wave radiation portion and a microstrip line primarily functioning as an electromagnetic wave resonance portion. A material for the dielectric layer 215, the thickness thereof, the length of the side of the patch portion, the length of the microstrip line, the size and position of the RTD 211, and the like are important factors for determining a basic oscillating frequency. In the case of this example, a patch portion having a rectangular pattern of L×L/2 is provided, and a microstrip line having a line width of 8 μm is extended from the center of the short side of the patch portion so as to intersect on the RTD 211 to form a T shape. In this case, L is 280 μm and the RTD 211 is arranged at a position of the microstrip line which corresponds to the anti-node of a resonating electromagnetic wave. The microstrip line is connected to the power supply 223 through the power supply line 218. As in the patch antenna type, the RTD 211 has a mesa structure having a diameter of 2 μm, is inserted between the upper electrode layer and the GND electrode layer 222, and is formed so as to be applied with a bias voltage necessary for driving.

In addition, a terahertz electromagnetic wave generation device 630 using a resonator having a slot antenna structure as shown in FIG. 7B may also be used. A slot antenna has a preferable structure to form an electromagnetic wave generation device operable at a higher frequency. In this case, the generation device 630 has the structure in which electrode Ti/Pd/Au layers 631 and 632 are laminated on an InP substrate 636 with a SiO2 insulating layer 633 interposed therebetween. A window region 634 formed by partially removing the electrodes 631 and 632 functions as a slot antenna type resonator, and the length of the window region is a factor to determine the oscillating frequency. In this example, the window width of a slot antenna 637 is set to 30 μm, and a mesa 635 having a one-side length of 2.3 μm is arranged. The mesa 635 is an RTD having a post shape. The electrode Ti/Pd/Au layers 631 and 632 are ohmic electrodes and are connected to the controller 229 through the power supply 223. In addition, a bias may be applied to a luminous layer (not shown) through the power supply 228 and is selected in accordance with a desired frequency.

In addition, even when a three-dimensional cavity waveguide having a high Q value as an electromagnetic wave resonator is used in which the rear surface and wall surfaces are covered with electrodes, a terahertz electromagnetic wave generation device can also be provided. In addition, when a resonator having a surface plasmon waveguide structure is used for an electromagnetic wave resonator, the structure more advantageous to realize a higher output can be provided. Since the window structure for external light incidence is not required in the present invention, an electromagnetic wave resonator can be freely selected as described above. Incidentally, the structures described above can be formed using the existing semiconductor process.

As described above, in the terahertz electromagnetic wave generation device of this example, when the intensity of the light from the luminous layer arranged on the same substrate is controlled, and the characteristics of the intersubband transition of the multiple quantum well structure are controlled, the frequency of a generated terahertz electromagnetic wave can be changed. As a result, a small current injection type terahertz electromagnetic wave generation device is realized which can realize frequency variable and frequency modulation with good controllability and which is excellent in high speed response. However, of course, the present invention is no limited to the structures described above.

Example 3

Inspection Apparatus

Example 3 will be described with reference to FIGS. 8A and 8B.

An inspection apparatus for inspecting an object according to this example is an apparatus using the terahertz electromagnetic wave generation device of Example 2.

Figure 8A:
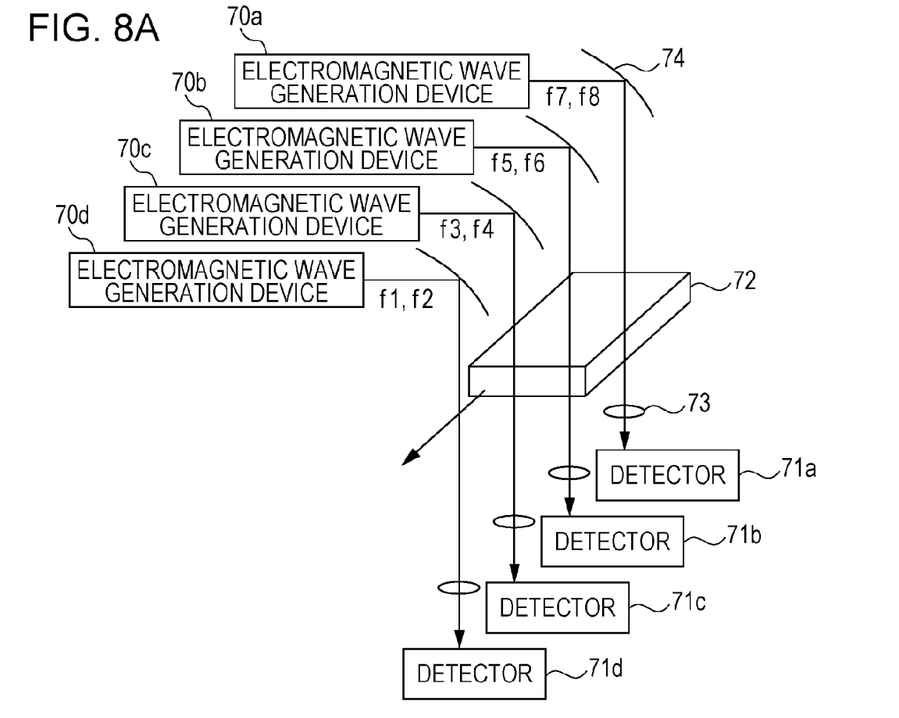
FIG. 8A is a schematic view of an inspection apparatus of Example 3 of the present invention.

As shown in FIG. 8A, in the inspection apparatus of this example, for example, frequency variable electromagnetic wave generation devices 70a to 70d of the above example are arranged in parallel, and electromagnetic waves having a plurality of oscillating frequencies f1 to f8 are generated. In this case, the frequencies f1 to f8 can be each changed and/or modulated by inputting a stress signal into the electromagnetic wave generation device, and/or by changing the polarity of a bias voltage using a switch. In addition, each electromagnetic wave propagates as parallel beams by a parabolic mirror 74 and radiates on an object substance 72 to be inspected, and transmitted light beams are condensed by lenses 73 and are received by detectors 71a to 71d. Although a transmission arrangement is used in this example, inspection may be performed in a reflection arrangement.

For example, intensity combination patterns to be received by the detectors are stored beforehand in a storage device. In addition, it is assumed that an inspection material has a specific absorption spectrum of at least one of the frequencies f1 to f8. In this case, when the absorption spectrum of the inspection material and the patterns stored beforehand are compared to each other, it is judged whether the material to be inspected is contained in the object substance 72 or not.

Figure 8B:
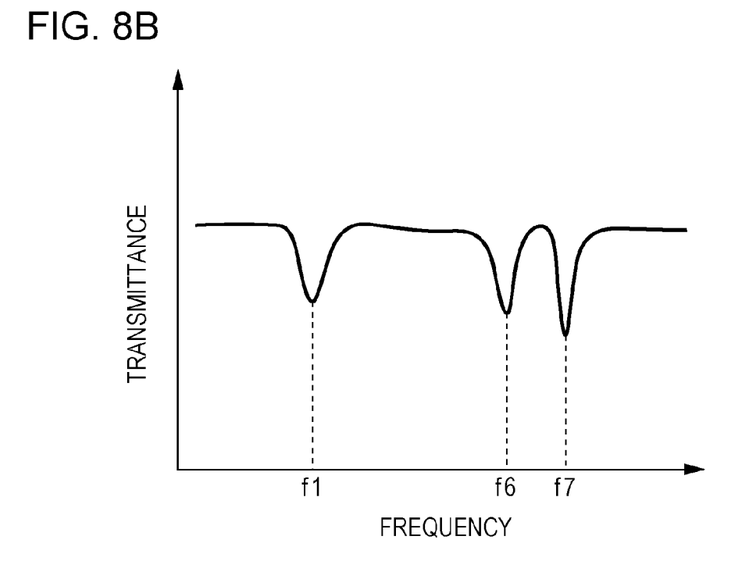
FIG. 8B is a graph illustrating the relationship between the transmittance and the frequency of the inspection apparatus shown in FIG. 8A.

FIG. 8B shows one example of a fingerprint spectrum of the inspection material. Since absorption peaks are present at frequencies f1, f6, and f7, when the absorption pattern of this material is stored beforehand and is compared with the information in which detector outputs at the frequencies f1, f6, and f7 are weak, and detector outputs at the other frequencies are strong, it can be judged that this material is contained.

The inspection apparatus of this example is applicable, for example, to inspections of dangerous substances, banned substances, and the like in airports, inspections of physical distribution goods, such as mails, cargoes, and the like, and inspections of industrial products in factories. In the case described above, since inspection can be performed by one inspection apparatus using a larger number of frequencies, a larger number of inspection materials can be inspected.

Example 4

Heterodyne Detector

Example 4 will be described with reference to FIGS. 9A and 9B.

This example provides a heterodyne detector using, for example, the electromagnetic wave generation device which includes a resonant tunneling diode described in Example 2 as a local oscillator.

Figure 9A:
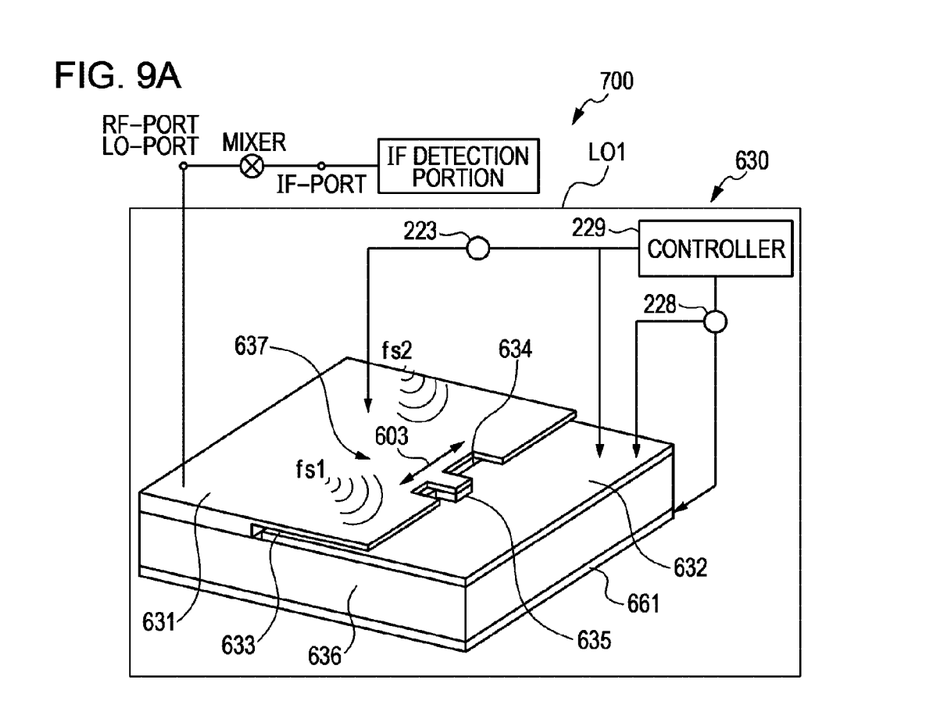
FIG. 9A is a schematic view of a detector of Example 4 of the present invention.
Figure 9B:
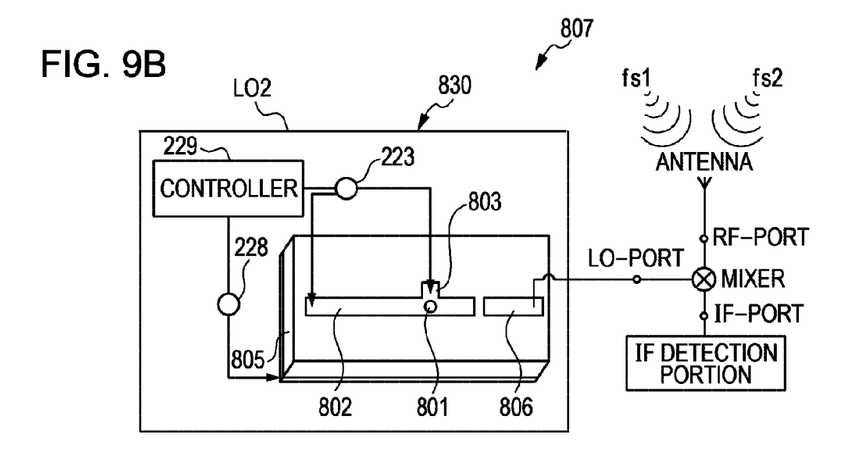
FIG. 9B is a schematic view of another detector of Example 4.

FIGS. 9A and 9B are schematic views each showing the detector of this example. FIG. 9A shows one example in which a slot antenna type electromagnetic wave resonator is used as the local oscillator. FIG. 9B shows one example in which a microstrip type electromagnetic wave resonator is used as the local oscillator.

The detector of this example is formed, for example, of a local oscillator (LO), a mixer, an intermediate frequency (IF) detection portion, an antenna, an LO-port, an RF-port, and IF-port. In this case, as the local oscillator (LO), the electromagnetic wave oscillator of the above example is used. In addition, the mixer is a device which efficiently converts an RF power into an IF power, and a Schottky diode, a superconductive SIS mixer, a hot electron bolometer, a HBT/HEMT mixer, or the like is used. In addition, the IF detection portion functions to detect an intermediate frequency (IF) output generated by mixing, and the antenna functions to receive an electromagnetic wave to be detected. Furthermore, the LO-port and the RF-port are input ports for inputting a locally generated wave and a signal wave, respectively, to the mixer, and the IF-port is an input port for inputting an intermediate frequency (IF) to the IF detection portion. Although not shown in the figure, if a high frequency filter, a radio frequency (RF) amplifier, and/or the like is arranged between the antenna, the mixer, and a local oscillator (LO1 or LO2), a higher sensitivity detector can be realized.

First, the detector of this example will be described in detail with reference to FIG. 9A. A detector 700 uses the electromagnetic wave generation device 630 having the slot antenna 637 as the local oscillator (LO1). In the electromagnetic wave generation device 630, the intensity of light from the luminous layer is controlled by the controller 229 and the power supply 228, so that the frequency of a generated terahertz electromagnetic wave can be changed and modulated. Hence, when the electromagnetic wave generation device is used as the local oscillator (LO1), a frequency having a wide bandwidth (for example from $f_L1$ to $f_L2$) can be inputted into the detector from one local oscillator. In addition, in the detector 700, the slot antenna type resonator structure 637 also functions as an antenna for receiving electromagnetic waves (from $f_S1$ to $f_S2$). The received electromagnetic waves and the oscillation output from the electromagnetic wave generation device 630 are inputted into the mixer from the RF-port and the LO-port, and the intermediate frequency (IF) which is a difference frequency component is generated by frequency-mixing. The generated intermediate frequency (IF) is detected in the IF detection portion through the IF-port.

The operation of the detector will now be described. For example, when an RTD drive bias is inputted into the electromagnetic wave generation device 630 from the power supply 223, the frequency $f_L1$ is oscillated from the local oscillator (LO1). In this case, since the detector 700 receives a signal wave 1 having a frequency $f_S1$ ($=|f_L1+f_{IF}|$) by the antenna, and the intermediate frequency $f_{IF}$ outputted from the mixer is detected by the IF detection portion, the signal wave 1 is detected. In addition, when an optical modulation bias is inputted into the electromagnetic wave generation device 630 from the power supply 228, the frequency $f_L2$ is oscillated from the local oscillator (LO1). In this case, since the detector 700 receives a signal wave 2 having a frequency $f_S2$ ($=|f_L2+f_{IF}|$) by the antenna, and the intermediate frequency $f_{IF}$ outputted from the mixer is detected by the IF detection portion, the signal wave 2 is detected.

In addition, as shown in FIG. 9B, in an example in which an electromagnetic wave generation device 830 including a microstrip type resonator and a resonant tunneling diode as a local oscillator is used, the detection similar to that described above can also be performed. The local oscillator LO2 of a detector 807 includes an RTD 801, a microstrip line 802, a λ/4 stub 803, a locally generated wave output portion 806, and a substrate 805 and is formed by a general MMIC technique.

In any of the structures described above, when the intensity of light from the luminous layer is controlled so that the frequency from the local output oscillator LO2 is continuously changed from $f_L1$ to $f_L2$, the electromagnetic waves from $f_S1$ to $f_S2$ can be heterodyne detected.

As described above, when the oscillator using a resonant tunneling diode is used as a local oscillator in heterodyne mixing, a detector can be realized which is able to detect a terahertz electromagnetic wave having a wide bandwidth by itself.

In addition, by using the detector of this example, terahertz electromagnetic waves having a plurality of frequency bands can be detected by one detector; hence, the reduction in size and the increase in density of the detector can be easily achieved. Furthermore, when a plurality of the detectors of this example is arranged to form an array matrix, a small detector capable of detecting high frequency electromagnetic waves having a plurality of frequencies with high sensitivity can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-295444 filed Dec. 25, 2009, which is hereby incorporated by reference herein in its entirety.

What is claimed is:

1. An oscillation device for oscillating a terahertz wave comprising:
   a substrate;
   an active layer which is provided on an upper portion of the substrate and which has a multiple quantum well structure in which intersubband transition of carrier occurs; and
   a luminous layer which is provided on an upper portion of the substrate and which generates light by interband transition of carrier,
   wherein the luminous layer is arranged at a position at which the light generated in the luminous layer radiates on the active layer.

2. The oscillation device according to claim 1, further comprising:
   a first electrical-contact layer provided on an upper portion of the active layer; and
   a second electrical-contact layer provided on an upper portion of the substrate and on a lower portion of the active layer,
   wherein the luminous layer generates light having energy larger than bandgap energy in the second electrical-contact layer.

3. The oscillation device according to claim 2, further comprising:
   an electrode provided on an upper portion of the first electrical-contact layer for injecting carriers into the first electrical-contact layer,
   wherein the carriers injected into the first electrical-contact layer are extracted from the second electrical-contact layer.

4. The oscillation device according to claim 2,
   wherein the luminous layer is arranged at a position at which the light generated in the luminous layer radiates on the active layer through the second electrical-contact layer.

5. The oscillation device according to claim 1, further comprising:
   a resonance portion which is provided on an upper portion of the substrate and which resonates the terahertz wave generated in the active layer,
   wherein the resonance portion emits the resonated terahertz wave.

6. The oscillation device according to claim 1,
   wherein the luminous layer comprises a p-type semiconductor and an n-type semiconductor and emits light at an interface therebetween.

7. The oscillation device according to claim 1, further comprising:
   a first electrical-contact layer provided on an upper portion of the active layer; and
   a second electrical-contact layer provided on an upper portion of the substrate and on a lower portion of the active layer, wherein the luminous layer is arranged at a position at which the light generated in the luminous layer radiates on the active layer through the second electrical-contact layer.

8. A semiconductor device comprising:
a substrate;
a multiple quantum well layer which is provided on an upper portion of the substrate and which is configured so that intersubband transition of carrier occurs;
a first electrical-contact layer provided on an upper portion of the multiple quantum well layer;
a second electrical-contact layer which is provided on an upper portion of the substrate and on a lower portion of the multiple quantum well layer; and
a luminous layer which is provided on an upper portion of the substrate and which generates light by interband transition of carrier,
wherein the luminous layer is arranged at a position at which the light generated in the luminous layer radiates on the multiple quantum well layer and generates light having energy larger than bandgap energy in the second electrical-contact layer.

* * * * *